United States Patent
Zou et al.

(10) Patent No.: US 10,048,325 B2
(45) Date of Patent: Aug. 14, 2018

(54) SWITCHING POWER SUPPLY BURN IN TEST CIRCUIT

(71) Applicant: Dongguan Guan Jia Electronic Equipment Co., Ltd., Dongguan (CN)

(72) Inventors: Shu Zou, Dongguan (CN); Gang Zheng, Dongguan (CN)

(73) Assignee: DONGGUAN GUAN JIA ELECTRONIC EQUIPMENT CO., LTD., Dongguan (CN)

( * ) Notice: Subject to any disclaimer, the term of this patent is extended or adjusted under 35 U.S.C. 154(b) by 0 days.

(21) Appl. No.: 15/531,551

(22) PCT Filed: Nov. 15, 2016

(86) PCT No.: PCT/CN2016/105924
§ 371 (c)(1),
(2) Date: May 30, 2017

(87) PCT Pub. No.: WO2017/211048
PCT Pub. Date: Dec. 14, 2017

(65) Prior Publication Data
US 2018/0196109 A1 Jul. 12, 2018

(30) Foreign Application Priority Data
Jun. 7, 2016 (CN) .......................... 2016 1 0402069

(51) Int. Cl.
*G01R 31/40* (2014.01)
*H02M 7/10* (2006.01)
(Continued)

(52) U.S. Cl.
CPC .............. *G01R 31/40* (2013.01); *H02J 1/102* (2013.01); *H02J 9/062* (2013.01); *H02M 7/10* (2013.01)

(58) Field of Classification Search
CPC .. H02M 2001/0003; H02M 1/32; H02M 1/36; H02M 7/02; H02M 7/10;
(Continued)

(56) References Cited

U.S. PATENT DOCUMENTS 9,595,873 B2 * 3/2017 Zane ................. H02M 3/33507
2005/0006958 A1 * 1/2005 Dubovsky ............... H02J 3/382
307/64

(Continued)

*Primary Examiner* — Emily P Pham
*Assistant Examiner* — Shahzeb K Ahmad
(74) *Attorney, Agent, or Firm* — Ming Chow; Sinorica, LLC

(57) ABSTRACT

A switching power supply burn in test circuit includes an AC/DC bidirectional converter, a DC/DC load and a first wire connecting end. The AC/DC bidirectional converter has an AC terminal connected to a power grid of the mains power, and a DC terminal connected to the first wire connecting end. The DC/DC load has an output terminal connected to the first wire connecting end. When the power supply to be tested is a DC/DC switching power supply, the input terminal of the DC/DC switching power supply is connected to the first wire connecting end, and its output terminal is connected to the input terminal of the DC/DC load. When the power supply to be tested is an AC/DC switching power supply, the input terminal of the AC/DC switching power supply is connected to the mains power and its output terminal is connected to the input terminal of the DC/DC load.

5 Claims, 6 Drawing Sheets

(51) Int. Cl.
*H02J 1/10* (2006.01)
*H02J 9/06* (2006.01)

(58) Field of Classification Search
CPC .... H02M 7/66; H02M 7/757; G01R 31/2817; G01R 31/40; G01R 31/42; H02J 9/062
See application file for complete search history.

(56) References Cited

U.S. PATENT DOCUMENTS

| | | | |
|---|---|---|---|
| 2011/0144822 A1* | 6/2011 | Choi | H02J 3/32 700/297 |
| 2013/0127482 A1* | 5/2013 | Chang | G01R 31/40 324/750.05 |
| 2014/0132169 A1* | 5/2014 | Boeke | H02J 1/102 315/201 |
| 2016/0181802 A1* | 6/2016 | Jacobson | H02M 7/02 307/31 |
| 2017/0077746 A1* | 3/2017 | Kanakasabai | H02J 9/061 |

* cited by examiner

SWITCHING POWER SUPPLY BURN IN TEST CIRCUIT

FIELD OF INVENTION

The present invention relates to the technical field of power supply burn in test, in particular to a power-saving burn in test for a switching power supply.

BACKGROUND OF INVENTION

1. Description of the Related Art

In general, a conventional switching power supply burn in test is performed by using a high power resistor as load, and electric energy is consumed and converted into heat by the resistor, and the test wastes tremendous energy unnecessarily.

To reduce the aforementioned waste of electric energy of the switching power supply during burn in test, an improved test circuit as shown in FIG. 1 is used for the switching power supply burn in test, wherein FIG. 1a shows that the power supply to be tested is an AC/DC power supply, and FIG. 1b shows that the power supply to be tested is a DC/DC power supply, wherein the DC/AC load and the DC/DC load are AC/DC converter and DC/DC converter respectively and they are used to substitute the high power resistor as a load and feeds back the electric energy to the input terminal of the power supply to be tested for a reuse, so as to reduce the waste of electric energy.

However, the aforementioned solution divides the power supply to be tested into the AC/DC power supply and the DC/DC power supply and uses different circuits as shown in FIGS. 1a and 1b for the burn in test, so that the test is relatively more troublesome and has a poor compatibility, so that manufacturers have to buy two different sets of testing equipments which will increase the cost. Therefore, two other improved solutions as shown in FIG. 2 are introduced. In FIG. 2a, when the power supply to be tested is a DC/DC power supply, K1 is open, and K2 is closed, and the AC/DC power supply receives power from utility grid and coverts the power into a direct current DC1 required by the test, and the direct current DC 1 is outputted to the DC/DC power supply to be tested, and then the DC/DC power supply to be tested converts the direct current DC 1 into a direct current DC2 and outputs the direct current DC2 to the DC/DC load, and the DC/DC load converts the direct current DC 2 into the direct current DC1 which is fed back to the input terminal of the DC/DC power supply to be tested for a reuse. When the power supply to be tested is an AC/DC power supply, K1 is closed, and K2 is open, and the utility grid supplies power to the AC/DC power supply to be tested for testing, and the AC/DC power supply to be tested converts the mains power into a direct current DC2 which is outputted to the DC/DC load, and the DC/DC load converts the direct current DC2 into the direct current DC1 which is outputted to the DC/AC load, and the DC/AC load converts the DC into AC which is fed back to the power grid for a reuse. In the improved solution as shown in FIG. 2b, the switches K1 and K2 are removed, and when the power supply to be tested is a DC/DC power supply, the current flow direction is AC/DC power supply→DC/DC power supply to be tested→DC/DC load→DC/AC load→AC/DC power supply to achieve the effect of reusing the electric energy. When the power supply to be tested is an AC/DC power supply, the current flow direction is power grid→AC/DC power supply to be tested→DC/DC load→DC/AC load→power grid to achieve the effect of reusing the electric energy. Although the two improved solutions as shown in FIG. 2 can overcome the compatibility issue and test both DC/DC power supply and AC/DC power supply by one circuit, yet there are still drawbacks. The improved solution as shown in FIG. 2a has a relatively more complicated circuit structure and requires manually switching K1 and K2 and thus may go wrong easily. The improved solution as shown in FIG. 2b can simplify the structure by omitting the switches K1 and K2, yet the testing of both DC/DC power supply and AC/DC power supply has two loads (the DC/DC load and the DC/AC load), and thus wasting electric energy.

2. Summary of the Invention

Therefore, it is a primary objective of the present invention to overcome the drawbacks of the prior art by providing a switching power supply burn in test circuit with the features of good compatibility and simple structure and capable of reducing the waste of electric energy.

To achieve the aforementioned and other objectives, the present invention provides a switching power supply burn in test circuit, comprising: an AC/DC bidirectional converter, a DC/DC load and a first wire connecting end, and the AC/DC bidirectional converter having an AC terminal coupled to a power grid of the mains power, and the DC terminal being coupled to a first wire connecting end, and the DC/DC load having an output terminal coupled to the first wire connecting end, and when a power supply to be tested is a DC/DC switching power supply, an input terminal of the DC/DC switching power supply to be tested is coupled to the first wire connecting end and an output terminal of the DC/DC switching power supply to be test is coupled to an input terminal of the DC/DC load, and the AC/DC bidirectional converter rectifies the mains power into a direct current DC1 and outputs the direct current DC1 from the DC terminal of the AC/DC bidirectional converter through the first wire connecting end to the input terminal of the DC/DC switching power supply to be tested, and the DC/DC switching power supply to be tested converts the direct current DC1 into a direct current DC2 and outputs the direct current DC2 to the input terminal of the DC/DC load, and the DC/DC load converts the direct current DC2 into the direct current DC1 and outputs the direct current DC1 from the first wire connecting end to the input terminal of the DC/DC switching power supply to be tested for a reuse; when the power supply to be tested is an AC/DC switching power supply, an input terminal of the AC/DC switching power supply to be tested is coupled to a power grid of the mains power, and the output terminal of the AC/DC switching power supply to be tested is coupled to the input terminal of the DC/DC load, and the AC/DC switching power supply to be tested rectifies the mains power into a direct current DC2 and outputs the direct current DC2 to the input terminal of the DC/DC load, and the DC/DC load converts the direct current DC2 into the direct current DC1 and outputs the direct current DC1 through the first wire connecting end to the DC terminal of the AC/DC bidirectional converter, and the AC/DC bidirectional converter converts the direct current DC1 into an alternate current AC and outputs the alternate current AC from the AC terminal of the AC/DC bidirectional converter to a power grid of the mains power for a reuse.

The AC/DC bidirectional converter can rectify the alternate current (AC) into the direct current (DC) and also can convert the DC into AC to achieve the bidirectional flow of the electric energy, and the present invention uses this feature to simplify the switching power supply burn in test circuit simply comprised of the AC/DC bidirectional converter and the DC/DC load and test the DC/DC power supply and the AC/DC power supply with a good compatibility and one load less, so as to reduce the power consumption and the waste of electric energy.

Preferably, the direct current DC1 has a voltage value greater than the voltage value of the direct current DC2.

Preferably, the DC/DC load is a boost circuit.

Preferably, the AC/DC bidirectional converter comprises a plurality of switching tubes Q11-Q16, a plurality of capacitors C11-C12, an inductor L11 and a transformer T11, and the switching tubes Q11 and Q13 are connected in series with each other and then in parallel with the capacitor C11, and the switching tubes Q12 and Q14 are connected in series and then in parallel with the capacitor C11, and the transformer T11 has a primary coil connected in series with the switching tube Q15 and then in parallel with the capacitor C11 and a secondary coil connected in series with the switching tube Q16 and then in parallel with the capacitor C12, and the inductor L11 has an end connected to the contact point of the switching tubes Q11 and Q13 and the other end serving as a first terminal of an AC terminal of the AC/DC bidirectional converter connected to a fire wire of the mains power, and the contact point of the switching tubes Q12 and Q14 serving as a second terminal of the AC terminal of the AC/DC bidirectional converter connected a zero line of the mains power, and both ends of the capacitor C12 serve as a positive electrode and a negative electrode of the AC/DC bidirectional converter DC terminal respectively. The AC/DC bidirectional converter is applicable for a single-phase mains power or a small power.

Preferably, the AC/DC bidirectional converter comprises a plurality of switching tubes Q21-Q34, a plurality of inductors L21-L24, a plurality of capacitors C21-C22, a transformer T21 and a diode D21, and the inductor L24 is a conjugate inductor, and the switching tubes Q21 and Q24 are connected in series with each other and then in parallel with the capacitor C21, and the switching tubes Q22 and Q25 are connected in series with each other and then in parallel with the capacitor C21, and the switching tubes Q23 and Q26 are connected in series with each other and then in parallel with the capacitor C21, and a third terminal of the inductor L24 is connected to a first terminal of the capacitor C21, and the switching tubes Q27 and Q29 are connected in series with each other and then in parallel with a fourth terminal of the inductor L24 and a second terminal of the capacitor C21, and the switching tubes Q28 and Q30 are connected in series with each other and then in parallel with a further terminal of the inductor L24 and a second terminal of the capacitor C21, and the switching tubes Q31 and Q33 are connected in series with each other and then in parallel with the capacitor C22, and the switching tubes Q32 and Q34 are connected in series with each other and then in parallel with the capacitor C22, and both ends of the primary coil of the transformer T21 are connected to the contact point of the switching tubes Q27 and Q29 and the contact point of the switching tubes Q28 and Q30 respectively and both ends of the secondary coil of the transformer T21 are connected to the contact point of the switching tubes Q31 and Q33 and the contact point of the switching tubes Q32 and Q34 respectively, and the second terminal of the inductor L24 is connected to an end of the capacitor C22 and the first terminal is connected to the other end of the capacitor C22 through the diode D21, and an end of the inductor L21 is connected to the contact point of the switching tubes Q21 and Q24 and the other end of the inductor L32 serves as a first terminal of the AC/DC bidirectional converter connected a phase line of the three-phase mains power A, and an end of the inductor L22 is connected to the contact point of the switching tubes Q22 and Q25 and the other end of the inductor L22 serves as a second terminal of the AC terminal of the AC/DC bidirectional converter connected to a phase line of the three-phase mains power B, and an end of the inductor L23 is connected to the contact point of the switching tubes Q23 and Q26, and the other end of the inductor L23 serves as a third terminal of the AC terminal of the AC/DC bidirectional converter connected to a phase line of the three-phase mains power C, and both ends of the capacitor C22 serve as a positive electrode and a negative electrode of the DC terminal of the AC/DC bidirectional converter. The AC/DC bidirectional converter is applicable for a three-phase mains power or a large power.

DESCRIPTION OF THE PREFERRED EMBODIMENTS

To make it easier for our examiner to understand the objective of the invention, its structure, innovative features, and performance, we use a preferred embodiment together with the attached drawings for the detailed description of the invention. Exemplary embodiments are illustrated in referenced figures of the drawings. It is intended that the embodiments and figures disclosed herein are to be considered illustrative rather than restrictive.

Figure 1:
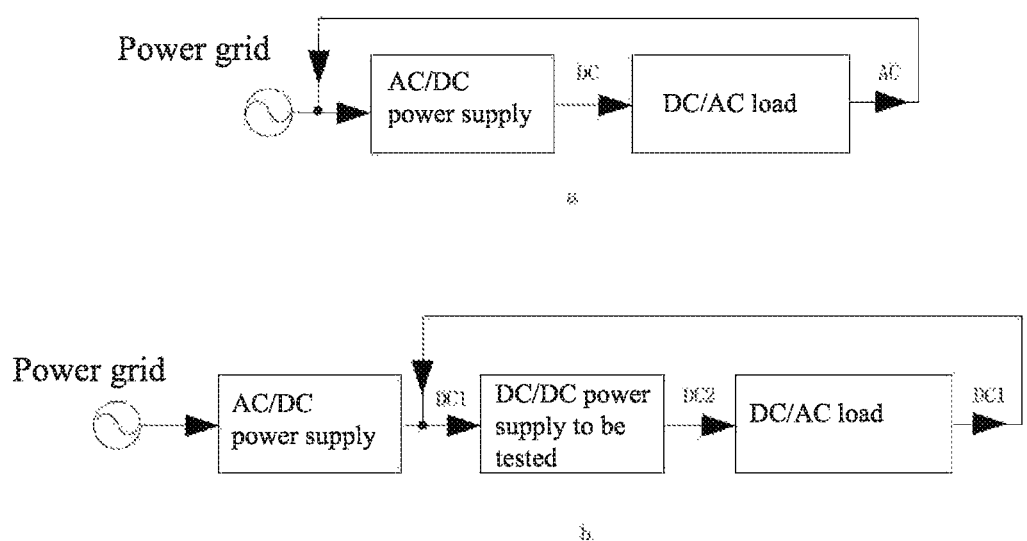
FIG. 1 is a circuit block diagram of a first conventional switching power supply burn in test circuit.
Figure 2:
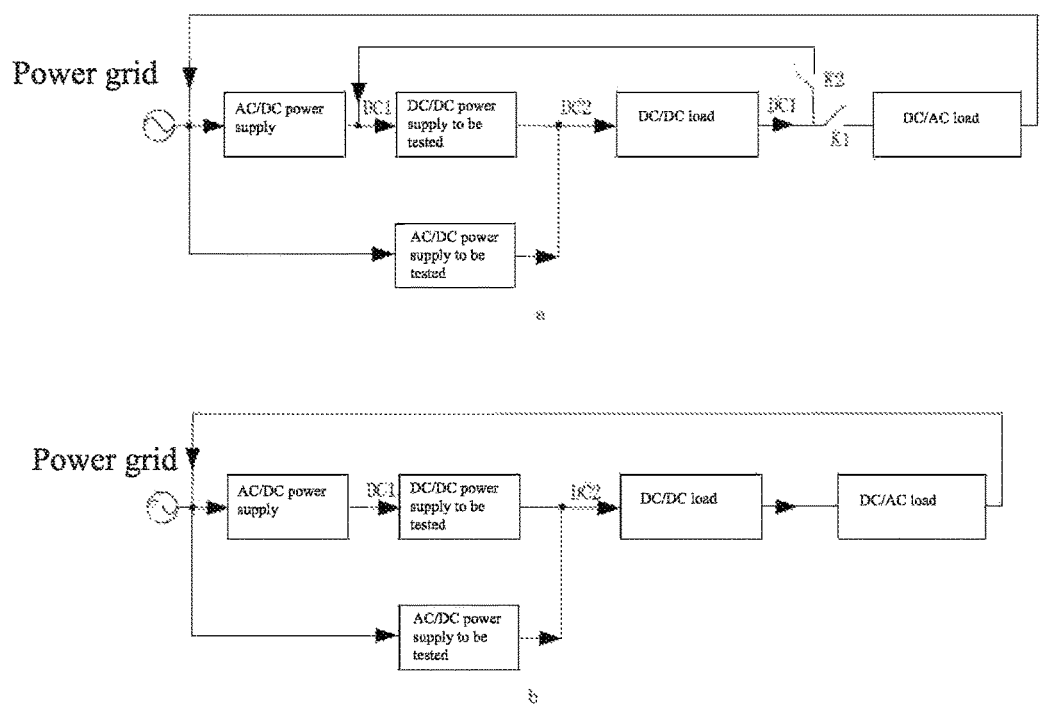
FIG. 2 is a circuit block diagram of a second conventional switching power supply burn in test circuit.
Figure 3:
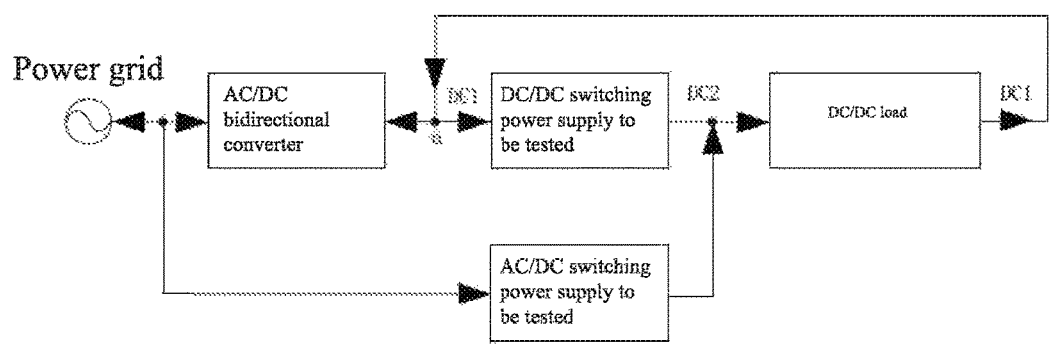
FIG. 3 is a circuit block diagram of a switching power supply burn in test circuit of the present invention.
Figure 6:
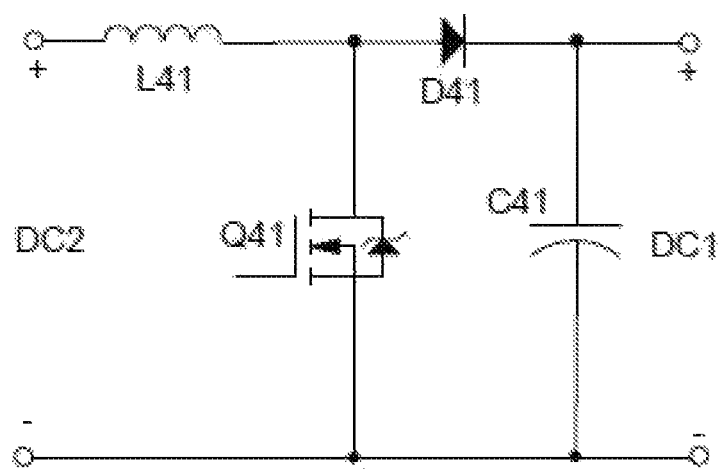
FIG. 6 is a circuit diagram of a DC/DC load in accordance with a preferred embodiment of the present invention.

With reference to FIG. 3 for a switching power supply burn in test circuit of a preferred embodiment of the present invention, the switching power supply burn in test circuit comprises an AC/DC bidirectional converter, a DC/DC load and a first wire connecting end a. Preferably, the DC/DC load is a boost circuit as shown in FIG. 6, and the AC/DC bidirectional converter has an AC terminal connected to a power grid of the mains power and a DC terminal connected to the first wire connecting end a, and the DC/DC load has an output terminal connected to the first wire connecting end a. When the power supply to be tested is a DC/DC switching power supply, the input terminal of the DC/DC switching power supply is connected to the first wire connecting end a and the output terminal of the DC/DC switching power supply is connected to the input terminal of the DC/DC load, and the AC/DC bidirectional converter rectifies the mains power into a direct current DC1 and outputs the direct current DC1 from the first wire connecting end a to the input terminal of the DC/DC switching power supply to be tested, and the DC/DC switching power supply to be tested converts the direct current DC1 into a direct current DC2 and outputs the direct current DC2 to the input terminal of the DC/DC load, wherein the direct current DC1 has a voltage value greater than the voltage value of the direct current DC2, and the DC/DC load converts the direct current DC2 into a direct current DC1 and outputs the direct current DC1 from the first wire connecting end a to the input terminal of the DC/DC switching power supply to be tested for a reuse. When the power supply to be tested is an AC/DC switching power supply, the AC/DC switching power supply to be tested has an input terminal connected to a power grid of the mains power and an output terminal connected to the input terminal of the DC/DC load, and the AC/DC switching power supply to be tested rectifies the mains power into a direct current DC2 and outputs the direct current DC2 to the input terminal of the DC/DC load, and the DC/DC load converts the direct current DC2 into the direct current DC1 and outputs the direct current DC1 from the first wire connecting end a to the DC terminal of the AC/DC bidirectional converter, and the AC/DC bidirectional converter converts the direct current DC1 into AC and outputs the AC from its AC terminal to a power grid of the mains power for a reuse. The AC/DC bidirectional converter can rectify the alternate current (AC) into the direct current (DC) and also can convert the DC into AC to achieve the bidirectional flow of the electric energy, and the present invention uses this feature to simplify the switching power supply burn in test circuit simply comprised of the AC/DC bidirectional converter and the DC/DC load and test the DC/DC power supply and the AC/DC power supply with a good compatibility and one load less, so as to reduce the power consumption and the waste of electric energy.

Figure 4:
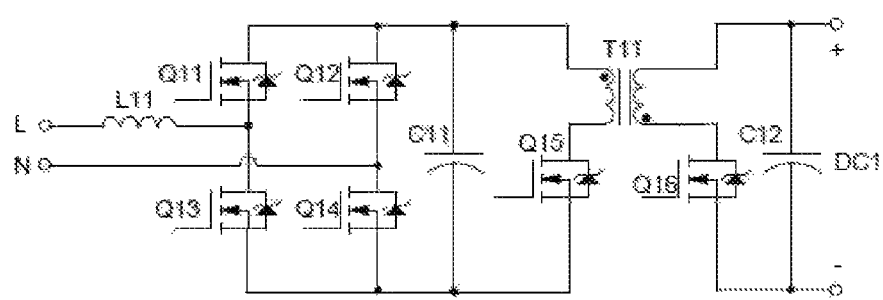
FIG. 4 is a circuit diagram of an AC/DC bidirectional converter in accordance with a first preferred embodiment of the present invention.

With reference to FIG. 4 for an AC/DC bidirectional converter in accordance with a preferred embodiment of the present invention, the AC/DC bidirectional converter comprises a plurality of switching tubes Q11-Q16, a plurality of capacitors C11-C12, an inductor L11 and a transformer T11, and the switching tubes Q11 and Q13 are connected in series with each other and then in parallel with the capacitor C11, and the switching tubes Q12 and Q14 are connected in series and then in parallel with the capacitor C11, and the transformer T11 has a primary coil connected in series with the switching tube Q15 and then in parallel with the capacitor C11 and a secondary coil connected in series with the switching tube Q16 and then in parallel with the capacitor C12, and the inductor L11 has an end connected to the contact point of the switching tubes Q11 and Q13 and the other end serving as a first terminal of an AC terminal of the AC/DC bidirectional converter connected to a fire wire of the mains power, and the contact point of the switching tubes Q12 and Q14 serving as a second terminal of the AC terminal of the AC/DC bidirectional converter connected a zero line of the mains power, and both ends of the capacitor C12 serve as a positive electrode and a negative electrode of the AC/DC bidirectional converter DC terminal respectively. The AC/DC bidirectional converter is applicable for a single-phase mains power or a small power.

Figure 5:
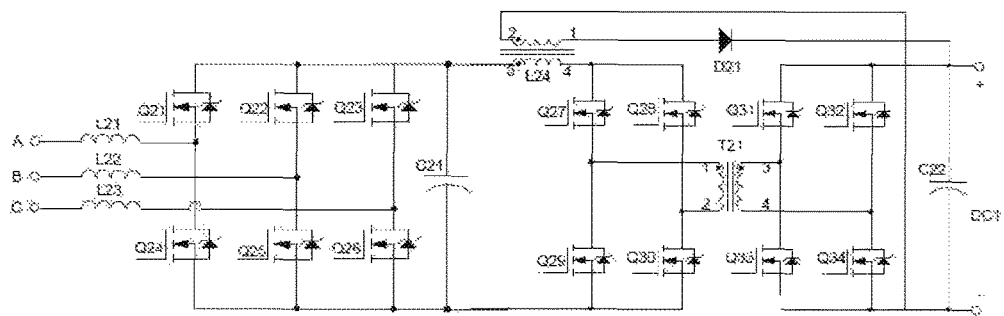
FIG. 5 is a circuit diagram of an AC/DC bidirectional converter in accordance with a second preferred embodiment of the present invention.

With reference to FIG. 5 for an AC/DC bidirectional converter in accordance with a preferred embodiment of the present invention, the AC/DC bidirectional converter comprises a plurality of switching tubes Q21-Q34, a plurality of inductors L21-L24, a plurality of capacitors C21-C22, a transformer T21 and a diode D21, and the inductor L24 is a conjugate inductor, and the switching tubes Q21 and Q24 are connected in series with each other and then in parallel with the capacitor C21, and the switching tubes Q22 and Q25 are connected in series with each other and then in parallel with the capacitor C21, and the switching tubes Q23 and Q26 are connected in series with each other and then in parallel with the capacitor C21, and a third terminal of the inductor L24 is connected to a first terminal of the capacitor C21, and the switching tubes Q27 and Q29 are connected in series with each other and then in parallel with a fourth terminal of the inductor L24 and a second terminal of the capacitor C21, and the switching tubes Q28 and Q30 are connected in series with each other and then in parallel with a further terminal of the inductor L24 and a second terminal of the capacitor C21, and the switching tubes Q31 and Q33 are connected in series with each other and then in parallel with the capacitor C22, and the switching tubes Q32 and Q34 are connected in series with each other and then in parallel with the capacitor C22, and both ends of the primary coil of the transformer T21 are connected to the contact point of the switching tubes Q27 and Q29 and the contact point of the switching tubes Q28 and Q30 respectively and both ends of the secondary coil of the transformer T21 are connected to the contact point of the switching tubes Q31 and Q33 and the contact point of the switching tubes Q32 and Q34 respectively, and the second terminal of the inductor L24 is connected to an end of the capacitor C22 and the first terminal is connected to the other end of the capacitor C22 through the diode D21, and an end of the inductor L21 is connected to the contact point of the switching tubes Q21 and Q24 and the other end of the inductor L32 serves as a first terminal of the AC/DC bidirectional converter connected a phase line of the three-phase mains power A, and an end of the inductor L22 is connected to the contact point of the switching tubes Q22 and Q25 and the other end of the inductor L22 serves as a second terminal of the AC terminal of the AC/DC bidirectional converter connected to a phase line of the three-phase mains power B, and an end of the inductor L23 is connected to the contact point of the switching tubes Q23 and Q26, and the other end of the inductor L23 serves as a third terminal of the AC terminal of the AC/DC bidirectional converter connected to a phase line of the three-phase mains power C, and both ends of the capacitor C22 serve as a positive electrode and a negative electrode of the DC terminal of the AC/DC bidirectional converter. The AC/DC bidirectional converter is applicable for a three-phase mains power or a large power.

The circuit structure and principle of the aforementioned two preferred embodiments of the AC/DC bidirectional converter are prior arts, and thus will not be repeated here, and the two AC/DC bidirectional converters may be selected according to the actual required situation.

While the invention has been described by means of specific embodiments, numerous modifications and variations could be made thereto by those skilled in the art without departing from the scope and spirit of the invention set forth in the claims.

What is claimed is:

1. A switching power supply burn in test circuit, comprising an AC/DC bidirectional converter, a DC/DC load and a first wire connecting end, and the AC/DC bidirectional converter having an AC terminal coupled to a power grid of the mains power, and the DC terminal being coupled to a first wire connecting end, and the DC/DC load having an output terminal coupled to the first wire connecting end, and when a power supply to be tested is a DC/DC switching power supply, an input terminal of the DC/DC switching power supply to be tested is coupled to the first wire connecting end and an output terminal of the DC/DC switching power supply to be test is coupled to an input terminal of the DC/DC load, and the AC/DC bidirectional converter rectifies the mains power into a direct current DC1 and outputs the direct current DC1 from the DC terminal of the AC/DC bidirectional converter through the first wire connecting end to the input terminal of the DC/DC switching power supply to be tested, and the DC/DC switching power supply to be tested converts the direct current DC1 into a direct current DC2 and outputs the direct current DC2 to the input terminal of the DC/DC load, and the DC/DC load converts the direct current DC2 into the direct current DC1 and outputs the direct current DC1 from the first wire connecting end to the input terminal of the DC/DC switching power supply to be tested for a reuse; when the power supply to be tested is an AC/DC switching power supply, an input terminal of the AC/DC switching power supply to be tested is coupled to a power grid of the mains power, and the output terminal of the AC/DC switching power supply to be tested is coupled to the input terminal of the DC/DC load, and the AC/DC switching power supply to be tested rectifies the mains power into a direct current DC2 and outputs the direct current DC2 to the input terminal of the DC/DC load, and the DC/DC load converts the direct current DC2 into the direct current DC1 and outputs the direct current DC1 through the first wire connecting end to the DC terminal of the AC/DC bidirectional converter, and the AC/DC bidirectional converter converts the direct current DC1 into an alternate current AC and outputs the alternate current AC from the AC terminal of the AC/DC bidirectional converter to a power grid of the mains power for a reuse.

2. The switching power supply burn in test circuit of claim 1, wherein the direct current DC1 has a voltage value greater than that voltage value of the direct current DC2.

3. The switching power supply burn in test circuit of claim 1, wherein the DC/DC load is a boost circuit.

4. The switching power supply burn in test circuit of claim 1, wherein the AC/DC bidirectional converter comprises a plurality of switching tubes Q11-Q16, a plurality of capacitors C11-C12, an inductor L11 and a transformer T11, and the switching tubes Q11 and Q13 are connected in series with each other and then in parallel with the capacitor C11, and the switching tubes Q12 and Q14 are connected in series and then in parallel with the capacitor C11, and the transformer T11 has a primary coil connected in series with the switching tube Q15 and then in parallel with the capacitor C11 and a secondary coil connected in series with the switching tube Q16 and then in parallel with the capacitor C12, and the inductor L11 has an end connected to the contact point of the switching tubes Q11 and Q13 and the other end serving as a first terminal of an AC terminal of the AC/DC bidirectional converter connected to a fire wire of the mains power, and the contact point of the switching tubes Q12 and Q14 serving as a second terminal of the AC terminal of the AC/DC bidirectional converter connected a zero line of the mains power, and both ends of the capacitor C12 serve as a positive electrode and a negative electrode of the AC/DC bidirectional converter DC terminal respectively.

5. The switching power supply burn in test circuit of claim 1, wherein the AC/DC bidirectional converter comprises a plurality of switching tubes Q21-Q34, a plurality of inductors L21-L24, a plurality of capacitors C21-C22, a transformer T21 and a diode D21, and the inductor L24 is a conjugate inductor, and the switching tubes Q21 and Q24 are connected in series with each other and then in parallel with the capacitor C21, and the switching tubes Q22 and Q25 are connected in series with each other and then in parallel with the capacitor C21, and the switching tubes Q23 and Q26 are connected in series with each other and then in parallel with the capacitor C21, and a third terminal of the inductor L24 is connected to a first terminal of the capacitor C21, and the switching tubes Q27 and Q29 are connected in series with each other and then in parallel with a fourth terminal of the inductor L24 and a second terminal of the capacitor C21, and the switching tubes Q28 and Q30 are connected in series with each other and then in parallel with a further terminal of the inductor L24 and a second terminal of the capacitor C21, and the switching tubes Q31 and Q33 are connected in series with each other and then in parallel with the capacitor C22, and the switching tubes Q32 and Q34 are connected in series with each other and then in parallel with the capacitor C22, and both ends of the primary coil of the transformer T21 are connected to the contact point of the switching tubes Q27 and Q29 and the contact point of the switching tubes Q28 and Q30 respectively and both ends of the secondary coil of the transformer T21 are connected to the contact point of the switching tubes Q31 and Q33 and the contact point of the switching tubes Q32 and Q34 respectively, and the second terminal of the inductor L24 is connected to an end of the capacitor C22 and the first terminal is connected to the other end of the capacitor C22 through the diode D21, and an end of the inductor L21 is connected to the contact point of the switching tubes Q21 and Q24 and the other end of the inductor L32 serves as a first terminal of the AC/DC bidirectional converter connected a phase line of the three-phase mains power A, and an end of the inductor L22 is connected to the contact point of the switching tubes Q22 and Q25 and the other end of the inductor L22 serves as a second terminal of the AC terminal of the AC/DC bidirectional converter connected to a phase line of the three-phase mains power B, and an end of the inductor L23 is connected to the contact point of the switching tubes Q23 and Q26, and the other end of the inductor L23 serves as a third terminal of the AC terminal of the AC/DC bidirectional converter connected to a phase line of the three-phase mains power C, and both ends of the capacitor C22 serve as a positive electrode and a negative electrode of the DC terminal of the AC/DC bidirectional converter.

* * * * *